United States Patent [19]

Chung et al.

[11] Patent Number: 5,858,875
[45] Date of Patent: Jan. 12, 1999

[54] INTEGRATED CIRCUITS WITH BORDERLESS VIAS

[75] Inventors: Henry Wei-Ming Chung, Cupertino; Kevin Carl Brown, Sunnyvale, both of Calif.

[73] Assignee: National Semiconductor Corporation, Santa Clara, Calif.

[21] Appl. No.: 748,426

[22] Filed: Nov. 13, 1996

Related U.S. Application Data

[60] Continuation of Ser. No. 444,885, May 19, 1995, which is a division of Ser. No. 383,587, Feb. 3, 1995, abandoned.

[51] Int. Cl.$^6$ .................................................. H01L 21/44
[52] U.S. Cl. ............................ 438/634; 438/653; 438/741
[58] Field of Search ..................................... 438/634, 740, 438/970, 741, 627, 643, 653; 148/DIG. 102; 257/757, 758

[56] References Cited

U.S. PATENT DOCUMENTS

| 4,523,372 | 6/1985 | Balda et al. | 437/195 |
|---|---|---|---|
| 4,656,732 | 4/1987 | Teng et al. | 29/591 |
| 4,948,755 | 8/1990 | Mo | 437/195 |
| 5,005,067 | 4/1991 | Sakata et al. | 357/54 |
| 5,187,122 | 2/1993 | Bonis | 437/200 |
| 5,243,220 | 9/1993 | Shibata et al. | 257/748 |
| 5,262,353 | 11/1993 | Sun et al. | 437/195 |
| 5,286,674 | 2/1994 | Roth et al. | 437/190 |
| 5,290,720 | 3/1994 | Chen | 437/235 |
| 5,291,066 | 3/1994 | Neugebauer et al. | 257/750 |
| 5,300,814 | 4/1994 | Matsumoto et al. | 257/758 |
| 5,317,192 | 5/1994 | Chen et al. | 257/750 |
| 5,321,211 | 6/1994 | Haslam et al. | 174/262 |

(List continued on next page.)

FOREIGN PATENT DOCUMENTS

| 0444695 | 9/1991 | European Pat. Off. . |
| 0568385 | 11/1993 | European Pat. Off. . |

OTHER PUBLICATIONS

IBM Technical Disclosure Bulletin, vol. 33, No. 11, Apr. 1991, pp. 299–300.

S. Wolf et al. "Silicon Processing for the VLSI Era, vol. 1", Lattice Press, 1986, pp. 441,546,555,556.

Stanley Wolf Ph.D., "Silicon Processing for the VLSI Era, vol. 2—Process Integration: Chapter 4, Multilevel–Interconnect Technology for VLSI and ULSI," pp. 176–297 (particularly, pp. 240–259.)

Primary Examiner—John F. Niebling
Assistant Examiner—Ha Tran Nguyen
Attorney, Agent, or Firm—Limbach & Limbach L.L.P.

[57] ABSTRACT

A method of forming interconnecting layers in a semiconductor device whereby even if a via is misaligned with a metal line, a portion of the via not enclosed and capped by the metal is enclosed and capped by an etch stop spacer. The foundation layer includes a dielectric layer having a trench formed therein, the trench being filled with a plug material. The foundation layer further includes a barrier layer formed atop the dielectric layer. A metal layer is formed on the surface of the boundary layer, and a protection layer is formed on the surface of the metal layer. The protection layer and the metal layer are patterned to define a line of composite protection/metal on the surface of the boundary layer. An etch stop layer is formed which substantially conforms to the shape of the composite protection/metal line, including etch stop spacers conforming to the sidewall portions of the line. Selected portions of the etch stop layer are removed to expose the protection surface of the composite protection/metal line and portions of the boundary layer, while leaving the etch stop spacers. Portions of the boundary layer between the etch stop spacers are removed. A layer of via dielectric is formed that covers, and extends above, the line. A portion of the via dielectric layer above the composite protection/metal line is removed, exposing a portion of the protection surface of the composite protection/metal line. Finally, a portion of the protection surface from the composite protection/metal line is removed, leaving the metal portion of the line only.

11 Claims, 11 Drawing Sheets

U.S. PATENT DOCUMENTS

| | | | |
|---|---|---|---|
| 5,349,229 | 9/1994 | Wei et al. | 257/383 |
| 5,350,712 | 9/1994 | Shibato | 437/195 |
| 5,407,532 | 4/1995 | Fang et al. | 437/194 |
| 5,407,862 | 4/1995 | Miyamoto | 437/194 |
| 5,416,359 | 5/1995 | Oda | 257/751 |
| 5,462,893 | 10/1995 | Matsuoka et al. | 437/195 |
| 5,466,636 | 11/1995 | Cronin et al. | 437/187 |
| 5,545,581 | 8/1996 | Armacost et al. | 437/52 |

INTEGRATED CIRCUITS WITH BORDERLESS VIAS

This is a continuation of application Ser. No. 08/444,885 filed on May 19, 1995 which is a divisional application of application Ser. No. 08/383,587 filed on Feb. 3, 1995 now abandoned.

TECHNICAL FIELD OF THE INVENTION

The present invention relates to integrated circuits, and in particular, integrated circuits with borderless vias.

BACKGROUND OF THE INVENTION

Integrated circuit fabrication begins with a thin, polished slice of high-purity, single crystal semiconductor, usually silicon. Junctions (which make up devices) are formed between field oxide portions of the semiconductor slice. Metal lines in conductor layers provide necessary electrical connections between the devices. Dielectric (i.e. insulating) layers are formed between the conductor layers to isolate the metal lines from each other. Vias provide conducting paths through the dielectric layers to connect interconnects of different conductor layers.

Figure 1:
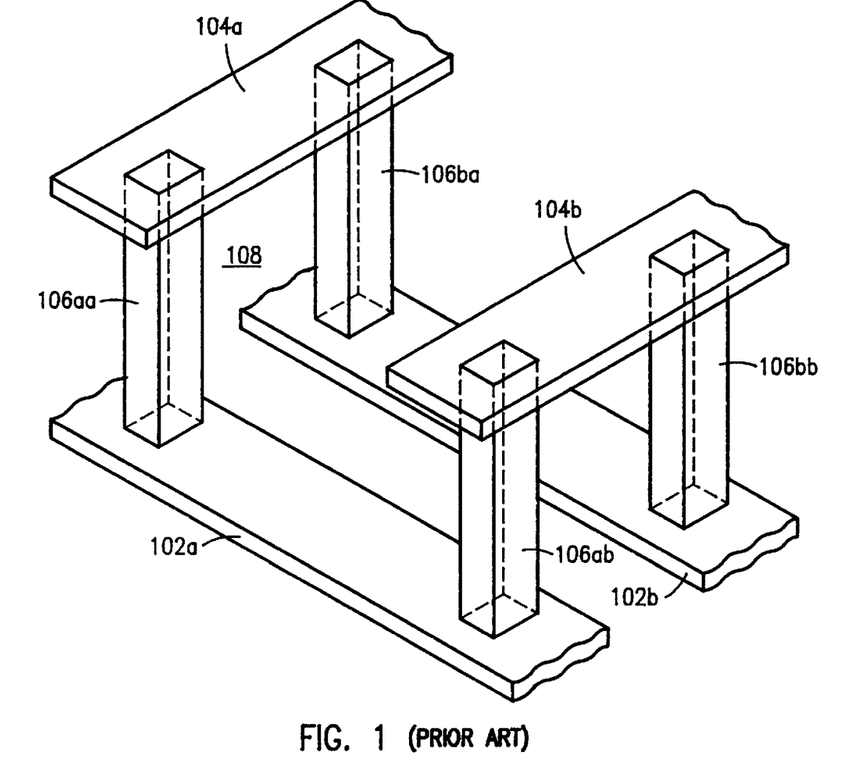
FIG. 1 is a perspective view of a portion of an integrated circuit having a conventional interconnect architecture.
Figure 2:
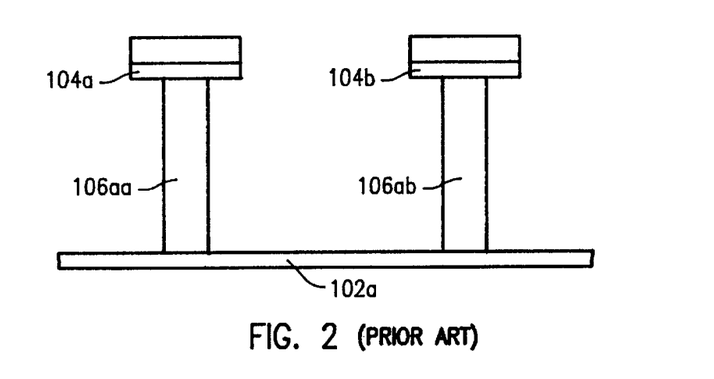
FIG. 2 is a cross-sectional view of the integrated circuit portion shown in FIG. 1.
Figure 3:
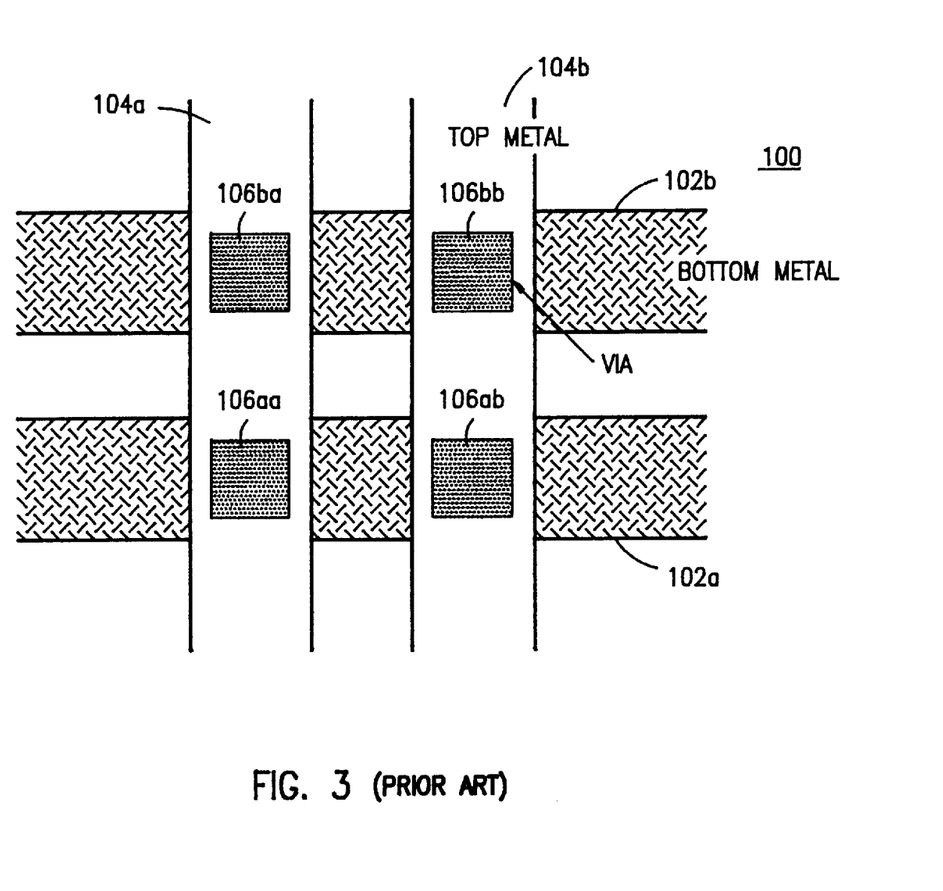
FIG. 3 is a plan view of the integrated circuit portion shown in FIGS. 1 and 2.

FIG. 1 is a perspective view of a portion 100 of an integrated circuit having a conventional interconnect architecture; FIG. 2 is a cross-sectional view of the integrated circuit portion 100 shown in FIG. 1; and FIG. 3 is a plane view of the integrated circuit portion 100 shown in FIGS. 1 and 2.

In the integrated circuit portion 100, two "bottom metal" strips 102a, 102b are formed in a bottom layer and two "top metal" strips 104a, 104b are formed perpendicular to the bottom metal strips 102a, 102b. Vias through a dielectric layer 108 connect the "top metal" strips to the "bottom metal" strips. In the integrated circuit portion 100 shown in FIGS. 1–3, via 106aa connects bottom metal strip 102a to top metal strip 104a; via 106ab connects bottom metal strip 102a to top metal strip 104b; via 106ba connects bottom metal strip 102b to top metal strip 104a; and via 106bb connects bottom metal strip 102b to top metal strip 104b.

As can be seen from FIGS. 1–3, in the integrated circuit portion 100 having the conventional interconnect architecture, each via is fully covered and is bordered by the top metal strip above it (overlap) and each via is also fully enclosed and bordered by the bottom metal strip below it (enclosure). Via borders provide allowance for interconnect misalignment and other process variations. That is, if a via is not fully bordered by the bottom metal strip to which it is to connect, during formation of the via, the dielectric layer, which is to insulate the bottom metal layer from the top metal layer, is attacked during etching of the vias. In extreme cases, even the devices may be attacked. Furthermore, if a via will not be fully bordered by the top metal strip to which it is to connect, the via liners can be attacked during etching of the top metal.

If the via borders required in the conventional interconnect architecture can be eliminated, increased packing density can be achieved. For example, in the conventional bordered via architecture, if the via size is 0.5 um, borders required to protect against potential via misalignment need to be at least 0.15 um. Thus, with bordered vias, the metal linewidth should be 0.8 um, the via size plus twice the via border. If the space between the metal lines at a particular level is 0.5 um, the metal pitch (linewidth+space) is 1.3 um for bottom and top metals running perpendicular to each other.

SUMMARY OF THE INVENTION

The present invention is a method of forming interconnecting layers in a semiconductor device whereby, even if a via is misaligned with a metal line, a portion of the via not enclosed by the metal is enclosed by an etch stop spacer.

A foundation layer includes a dielectric layer having a hole formed therein, the hole being filled with a plug material. The foundation layer further includes a barrier layer formed atop the dielectric layer.

In a first embodiment, a metal layer is formed on the surface of the boundary layer, and a protection layer is formed on the surface of the metal layer. The protection layer and the metal layer are patterned to define a line of composite protection/metal on the surface of the boundary layer. Alternately, the protection layer, the metal layer, and the boundary layer are patterned to define a line of composite protection/metal/boundary on the surface of the dielectric layer.

An etch stop layer is formed which substantially conforms to the shape of the composite protection/metal line. Selected portions of the etch stop layer are removed to expose the protection surface of the composite protection/metal line and portions of the boundary layer, while leaving etch stop spacers conforming to the side walls of the metal line. In a second embodiment, portions of the boundary layer between the etch stop spacers are also now removed.

A layer of via dielectric is formed that covers, and extends above, the line. A portion of the via dielectric layer above the composite protection/metal line is removed, exposing a portion of the protection surface of the composite protection/metal line. Finally, a portion of the protection surface from the composite protection/metal line (or, in the alternate embodiment, from the composite protection/metal/boundary line) is removed.

A better understanding of the features and advantages of the invention will be obtained by reference to the following detailed description and accompanying drawings which set forth an illustrative embodiment in which the principles of the invention are utilized.

BRIEF DESCRIPTION OF THE FIGURES

FIGS. 6–12 show the integrated circuit portion after being processed in accordance with a first embodiment of the present invention, in which:

FIGS. 14–19 show the integrated circuit portion after being processed in accordance with a second embodiment of the present invention, in which:

DETAILED DESCRIPTION OF THE INVENTION

A process for fabricating a borderless interconnect architecture in accordance with the present invention, as well as the borderless interconnect architecture itself, is now described.

Figure 4:
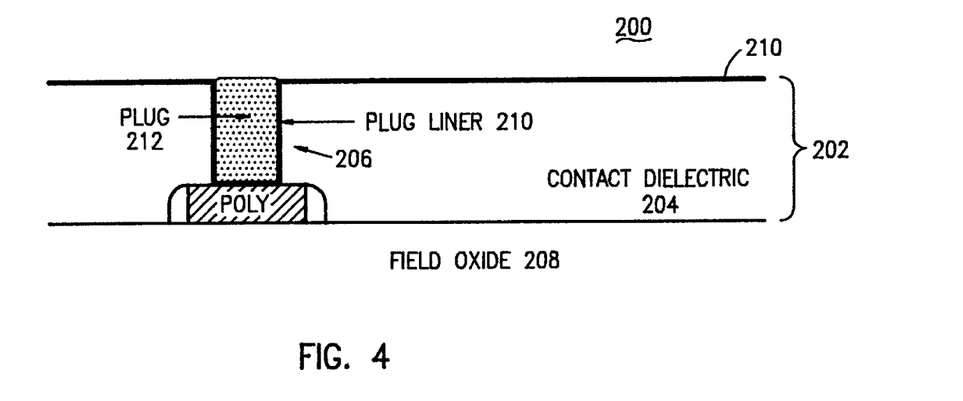
FIG. 4 shows, in cross section, an integrated circuit portion which comprises a conventional foundation layer fabricated by a conventional process.

FIG. 4 shows, in cross section, an integrated circuit portion 200 which comprises a conventional foundation layer 202 fabricated by a conventional process. The foundation layer includes a dielectric layer 204 having at least one trench (or contact) 206, shown in FIG. 4, which is a contact to poly formed, e.g., over a semiconductor field oxide layer 208, onto silicon. The trench 206 is lined with a plug liner 210. The foundation layer 202 further comprises a barrier layer which is a portion of the plug liner 210 that covers the contact dielectric layer 204. The trench 206 is filled with a plug material 212. For example, the contact 206 in FIG. 4 may be lined with a sputtered titanium ("Ti")/sputtered titanium nitride ("TiNx") bilayer; sputtered Ti/sputtered titanium-tungsten ("TiW") bilayer; sputtered Ti/sputtered tungsten ("W") bilayer; sputtered W single layer; sputtered Ti/chemical vapor deposited titanium nitride ("CVD TiNx") bilayer; or CVD Ti/CVD TiNx bilayer. The contact may be filled, for example, with chemical vapor deposited tungsten (CVD W). If necessary, a blanket etch-back or chemical-mechanical polishing process may be applied to remove plug material outside the plug hole 212, so that plug material remains only in the plug hole 212.

Figure 5:
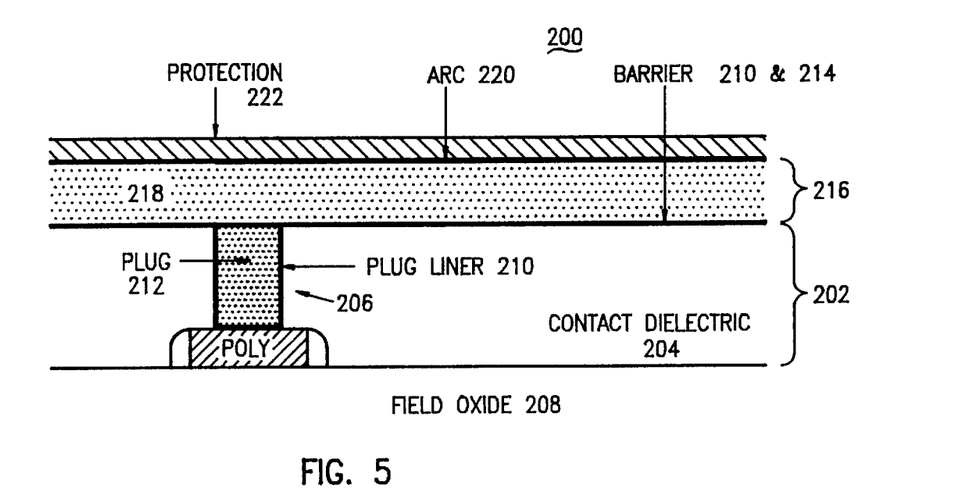
FIG. 5 shows the integrated circuit portion of FIG. 4 after it has been conventionally processed up to the point of bottom metal layer formation and after it has been processed in accordance with the present invention to form a protection layer atop a bottom metal layer.

FIG. 5 also shows the integrated circuit portion 200 of FIG. 4. As shown in FIG. 5, the barrier layer of the foundation layer further comprises a second layer 214. (In further discussion, the barrier layer is designated as 210+214.) The most common material used for the second layer 214 of the barrier layer 210+214 is a bi-layered film of Ti and TiNx. However, other materials, such as thin films of sputter deposited TiW or W, may also be employed in the place of TiNx.

As is now discussed, FIG. 5 shows the integrated circuit portion 200 after it has been conventionally processed up to the point of bottom metal layer formation. The bottom metal layer 216 includes a primary layer 218 and, optionally, an anti-reflection coating 220 ("ARC"). For the primary layer, a thin film of aluminum-based alloy (for example, Al-0.5% Cu or Al-1% Si-0.5% Cu) may be employed.

The ARC may be, for example, TiNx. The ARC, when present, improves the efficiency of the photo-lithography.

The integrated circuit portion 200 shown in FIG. 5 has been further processed, in accordance with the present invention, to form a protection layer 222 atop the bottom metal layer 216. The protection layer 222 may be, for example, an oxide layer formed by depositing a plasma-enhanced Tetraethyl Orthosilane ("PE-TEOS") oxide atop the bottom metal layer 216. In this case, as is discussed in detail below with reference to FIG. 7, the thickness of the protection oxide is related to the plasma-enhanced chemical vapor deposition silicon nitride ("PECVD silicon nitride") to oxide etch selectivity.

Figure 6:
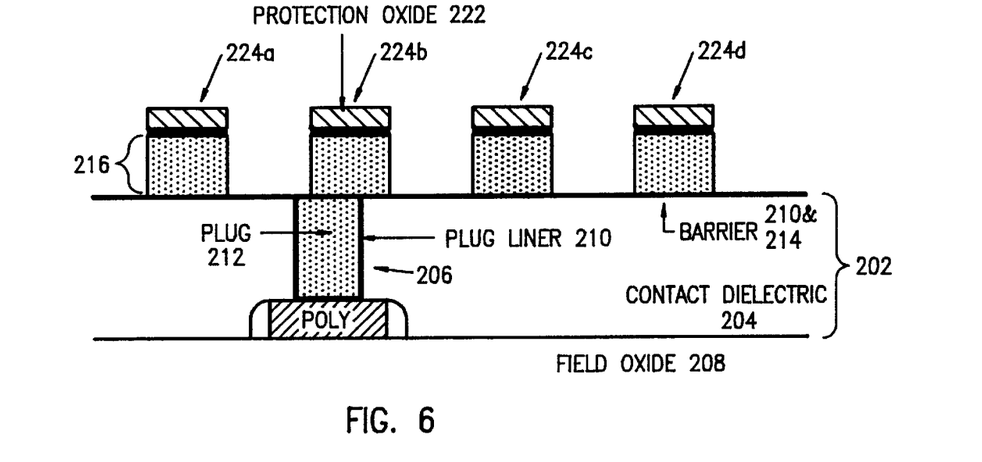
FIG. 6 shows the integrated circuit portion of FIG. 5 after the protection layer and the bottom metal layer have been patterned to define protection/metal composite lines.

FIG. 6 shows the integrated circuit portion 200 after the protection layer 222 and the bottom metal layer 216 have been patterned to define at least one line (four lines 224a–224d are shown in FIG. 6) of composite protection/metal on the surface of the boundary layer 210+214. The patterning may comprise, for example, a bottom metal mask step and a bottom metal etch step.

In the bottom metal mask step, photo-resist is spun on the protection oxide layer 222 of the integrated circuit portion 200. Then, a photo-lithographic technique is used to produce a desired interconnect pattern in the photo-resist.

In the bottom metal etch step, the protection silicon oxide is first etched in an anisotropic fluorine-based etch chemistry to remove the portion of the protective silicon oxide below the photo-exposed photo-resist. Then, the metal is etched in an anisotropic chlorine-based etch chemistry. Using an end-point detection method (e.g., optical spectroscopy or DC bias), the bottom metal etch is stopped on or in the barrier layer 210+214.

Figure 14:
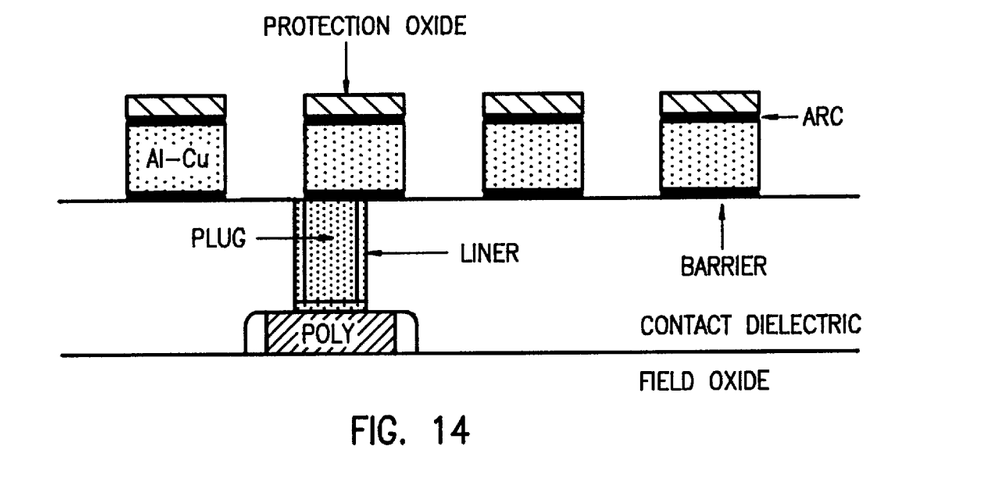
FIG. 14 shows the integrated circuit portion of FIG. 5 after the protection layer, the bottom metal layer, and the boundary layer have been patterned to define protection/metal/boundary composite lines.

In a first embodiment of the present invention, in the metal etch step, the second layer 214 of the barrier layer 210+214 is not etched through, and at this point the bottom metal formation process is not yet complete. However, in an alternate embodiment in accordance with the present invention, the etch chemistry used in the metal etch step is such that, although the second layer 214 of the barrier layer 210+214 is etched through, the etch chemistry will not etch through the plug liner 210 of the barrier layer. Thus, the plug itself is protected from being etched, even if the metal line is misaligned to the plug, obviating the need for an overlap. For example, if the plug liner 210 is W-based and the etch chemistry is chlorine-based, the plug liner will not be etched through. (FIG. 14 shows the integrated circuit portion 200' (for the alternate embodiment, the integrated circuit portion 200 has been alternately denoted by the numeral 200') after it has been processed through bottom metal formation in accordance with the alternate embodiment.)

Figure 7:
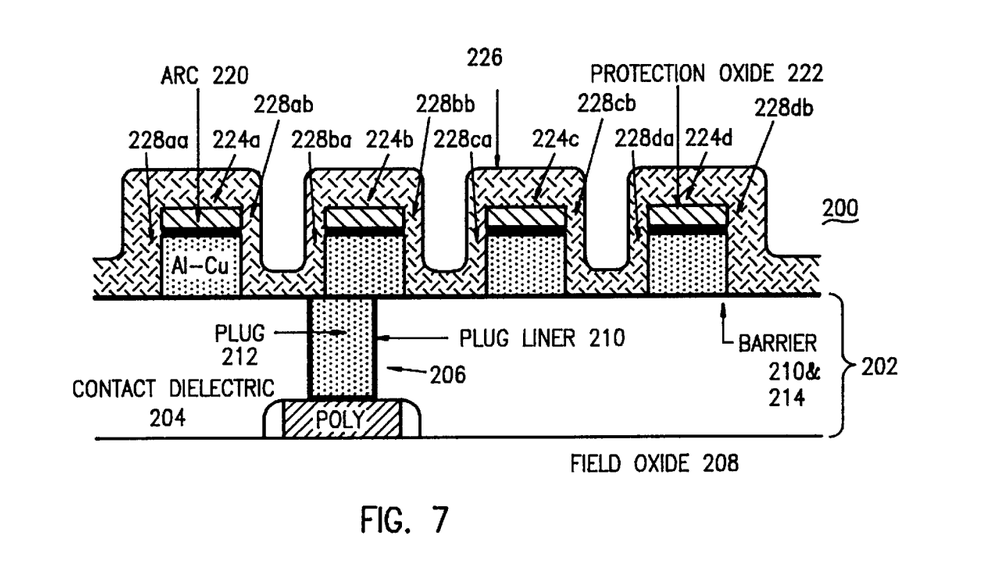
FIG. 7 shows the integrated circuit portion of FIG. 6 after an etch stop layer has been formed on the surface of the barrier layer and substantially conforming to the shape of the at least one line. The etch stop layer includes etch stop spacers on the sidewall portions of the line.
Figure 15:
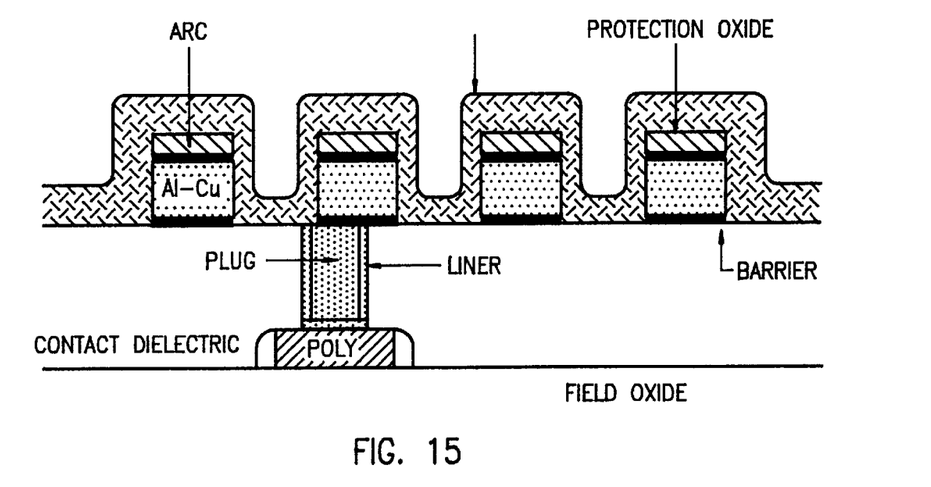
FIG. 15 shows the integrated circuit portion of FIG. 14 after an etch stop layer has been formed on the surface of the barrier layer and substantially conforming to the shape of the lines. The etch stop layer includes etch stop spacers on the sidewall portions of the lines.

FIG. 7 shows the integrated circuit portion 200 after an etch stop layer 226 has been formed on the surface of the barrier layer 214. (FIG. 15 shows the integrated circuit portion 200' after an etch stop layer 226 has been formed on the surface of the contact dielectric.) The etch stop layer 226 substantially conforms to the shape of the lines 224a–224d of composite protection/metal and thus includes etch stop spacers 228aa–228db on the sidewall portions of the lines. The etch stop layer 226 may be, for example, a silicon nitride film deposited by plasma-enhanced chemical vapor deposition ("PECVD silicon nitride"). As will be discussed with respect to FIG. 8, PECVD silicon nitride has two properties which make it preferable. First, a PECVD silicon nitride to silicon oxide etch selectivity equal to or greater than one can be achieved in a fluorine-based plasma etch chemistry by optimization of process parameters while a significantly large silicon oxide to silicon nitride selectivity can also be achieved by similar optimization in the same etch chemistry.

Referring still to FIG. 7, the thickness of the etch stop layer 226 is such that the coverage on the sides of the bottom metal lines 224a–224d is at least as large as the potential via misalignment to bottom metal and to contact. In other words, the thickness of the etch stop layer 226 is such that the thickness of the etch stop spacers 228aa–228db is at least as large as the via overlap and enclosure, and contact overlap, which would be used in the conventional interconnect fabrication process. Furthermore, the etch stop material should be thin enough, relative to the space between the metal lines 224a–224d, so that key holes (i.e. voids within the dielectric) are not formed between the metal lines 224a–224d.

Figure 8:
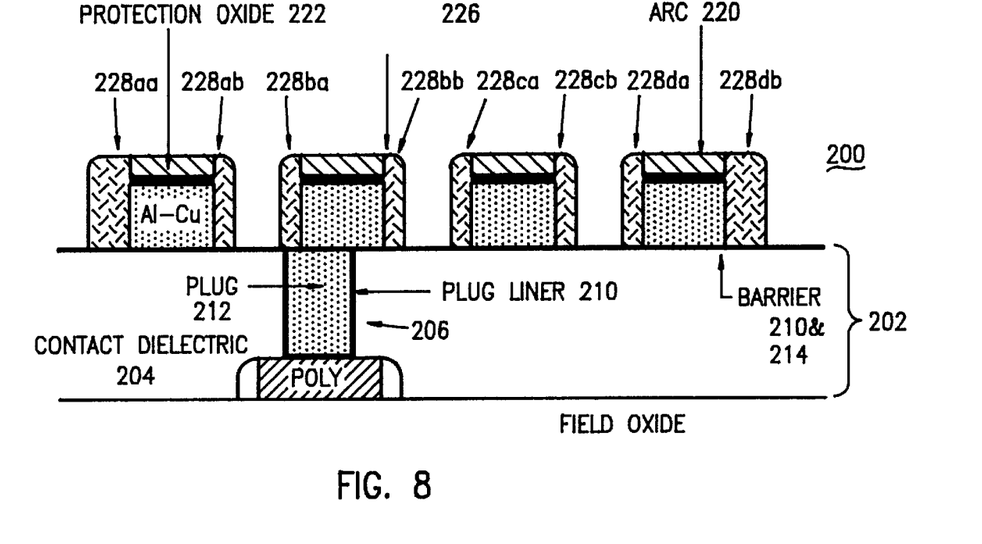
FIG. 8 shows the integrated circuit portion of FIG. 7 after selected portions of the etch stop layer have been removed, leaving the etch stop spacers.
Figure 16:
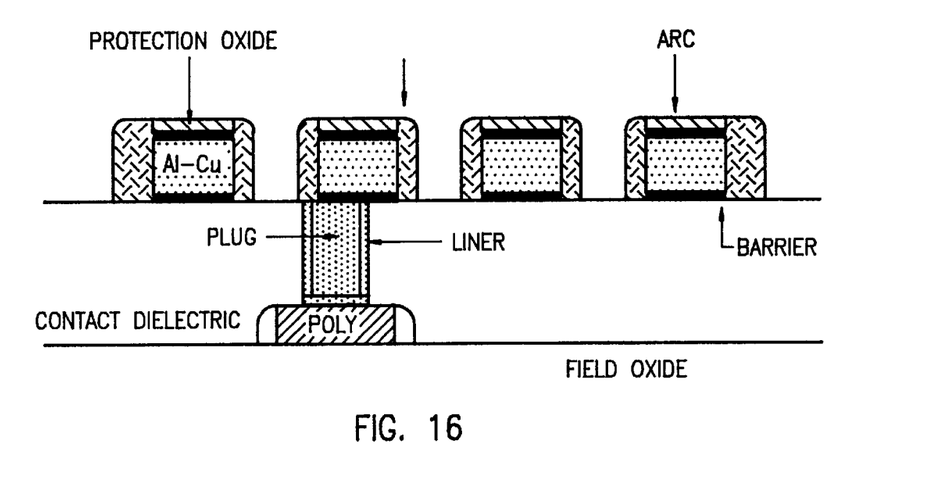
FIG. 16 shows the integrated circuit portion of FIG. 15 after selected portions of the etch stop layer have been removed, leaving the etch stop spacers.

FIG. 8 shows the integrated circuit portion 200 after selected portions of the etch stop layer 226 have been removed, leaving the etch stop spacers 228aa–228db. (FIG. 16 shows the integrated circuit portion 200' after selected portions of the etch stop layer 226 have been removed, leaving the etch stop spacers 228aa–228db.) For example, if the etch stop material is PECVD silicon nitride, a fluorine-based plasma etch is applied to completely remove the PECVD silicon nitride on top of, and in between, the bottom metal lines 224a–224d, except for the spacers 228aa–228ab. Preferably, the etch is anisotropic (i.e., it etches only in the vertical direction) so that the thickness of the PECVD silicon nitride etch stop spacers 228aa–228db, on the sidewalls of the bottom metal lines 224a–224d, is preserved. If the etch plasma chemistry is such that the PECVD silicon nitride to silicon oxide, and to TiNx, selectivity is greater than or equal to one, the etching stops in the protection oxide layer 222, on top of the metal lines 224a–224d and in the barrier layer 214 between the bottom metal lines 224a–224d. Furthermore, the protection oxide layer 222 ensures that, during etch, the top of the PECVD silicon nitride spacers 228aa–228db remain above the top surface of the metal lines 224a–224d.

Figure 9:
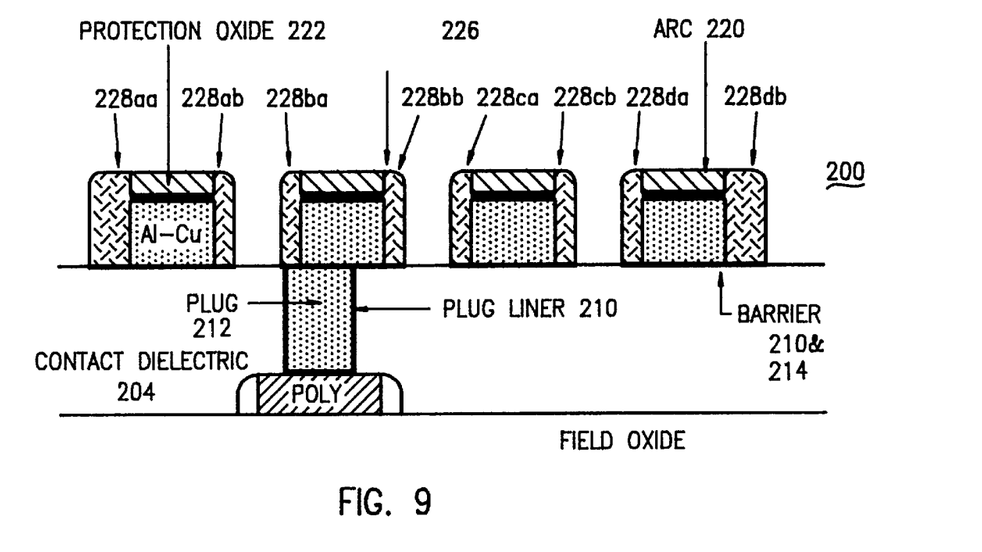
FIG. 9 shows the integrated circuit portion of FIG. 8 after portions of the boundary layer between the etch stop spacers have been removed.

FIG. 9 shows the integrated circuit portion 200 after the portions of the boundary layer between the etch stop spacers 228aa–228db have been removed, for example by a plasma etch, to electrically isolate the bottom metal lines 224a–224d from each other. (In the alternate embodiment, this step is not necessary since the bottom metal lines are electrically isolated from each other after the bottom metal etch step, which also etches through the exposed portions of the boundary layer.)

Figure 10:
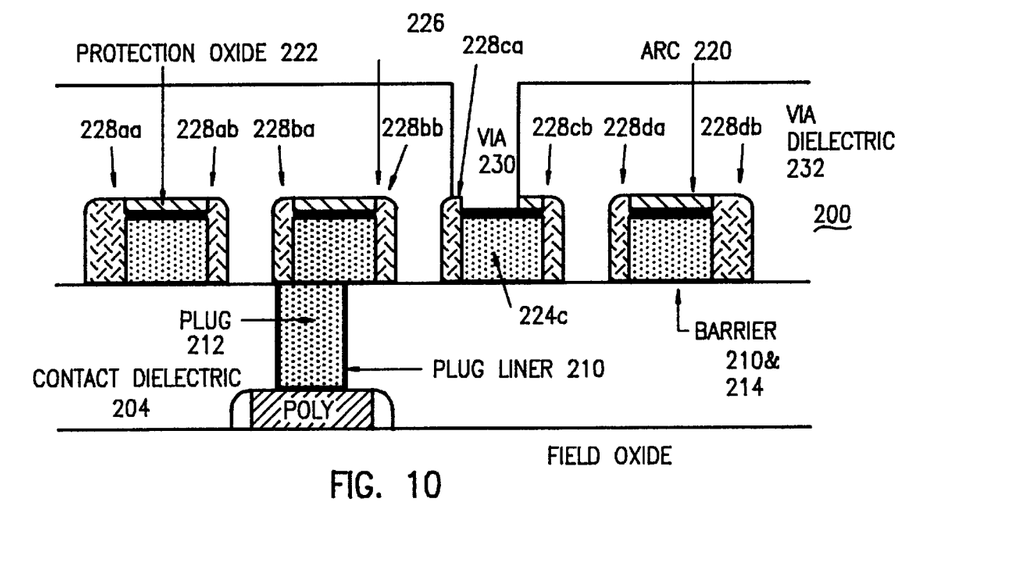
FIG. 10 shows the integrated circuit portion of FIG. 9 after a via hole trench has been formed in a via dielectric layer above a metal line.
Figure 17:
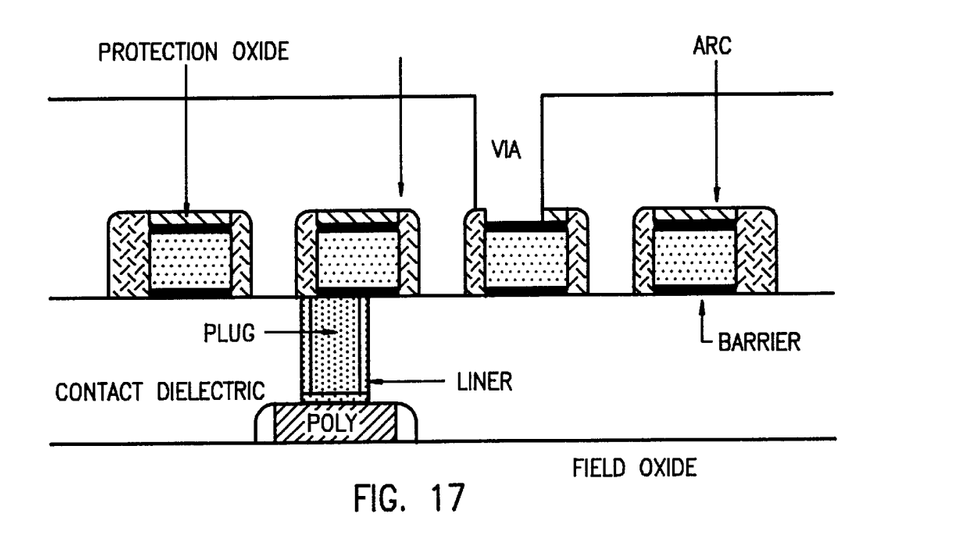
FIG. 17 shows the integrated circuit portion of FIG. 16 after a via hole trench has been formed in a via dielectric layer above a metal line.

FIG. 10 shows the integrated circuit portion 200 after a misaligned via 230 has been formed above the metal line 224c. (FIG. 17 shows the integrated circuit portion 200' after a via 230 has been formed above the metal line 224c.) First, a via dielectric layer 232 is formed that covers, and extends above, the metal lines 224a–224d. Then, a portion of the via dielectric layer 232, above the metal line 224c, the metal line to be interconnected, is removed to expose a portion of the protection/metal line 224c.

The via dielectric layer 232 can be formed, for example, by depositing gap-filling silicon oxide, such as spin on glass ("SOG") or TEOS-ozone silicon oxide. Optionally, after it has been deposited, the gap-filling oxide can be removed from the top of selected bottom metal lines using a blanket plasma etchback. Then, if SOG has been used to fill the gaps between the bottom metal lines, the SOG is cured at an elevated temperature. The gap-filling oxide is then capped, e.g., with a layer of PECVD TEOS oxide or silane oxide. Preferably, a chemical-mechanical polishing process is then employed to planarize the surface.

Then, the via pattern is produced by, for example, a photo-lithographic masking technique. A via etch is applied to open via holes where the via dielectric layer is exposed. The plasma chemistry used to etch the via holes is such that the silicon oxide to PECVD silicon nitride, and the silicon oxide to metal etch selectivity, are very high. Thus, the etch process stops in metal and PECVD silicon nitride. However, while the etch selectivity is high, it is not infinite. Thus, a small amount of silicon nitride spacer is removed during via etch. Thus, during the etch stop spacer formation step, discussed above with reference to FIGS. 7 and 8 (FIGS. 7 and 14 for the alternate embodiment), it is preferable that the PECVD silicon nitride spacers are formed higher than the level of the bottom metal lines with the use of the protection oxide.

Figure 11:
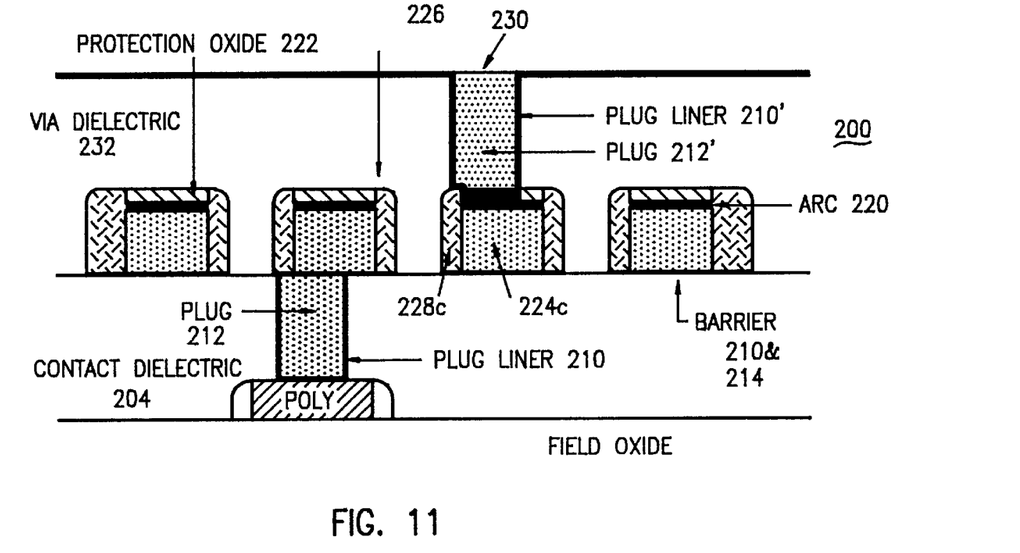
FIG. 11 shows the integrated circuit portion of FIG. 10 after the via hole trench has been lined with a plug liner and filled with a plug.
Figure 18:
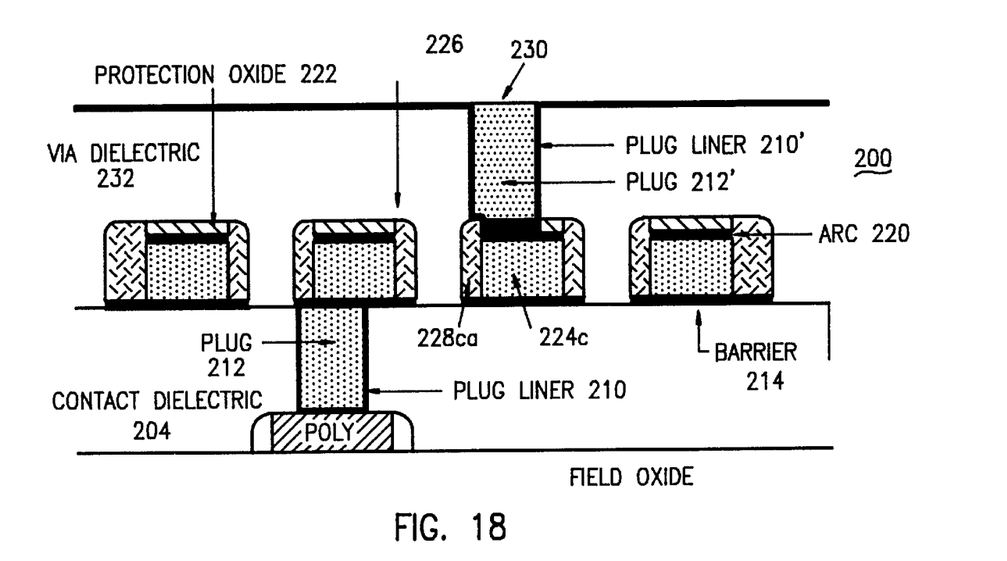
FIG. 18 shows the integrated circuit portion of FIG. 17 after the via hole trench has been lined with a plug liner and filled with a plug.

FIG. 11 shows the integrated circuit portion 200 after the via hole trench 230 has been lined with a plug liner 210' and filled with a plug 212', as discussed above with reference to FIG. 4. (FIG. 18 shows the integrated circuit portion 200' after the via hole trench 230 has been lined with a plug liner 210' and filled with a plug 212', as discussed above with reference to FIG. 4.)

Figure 12:
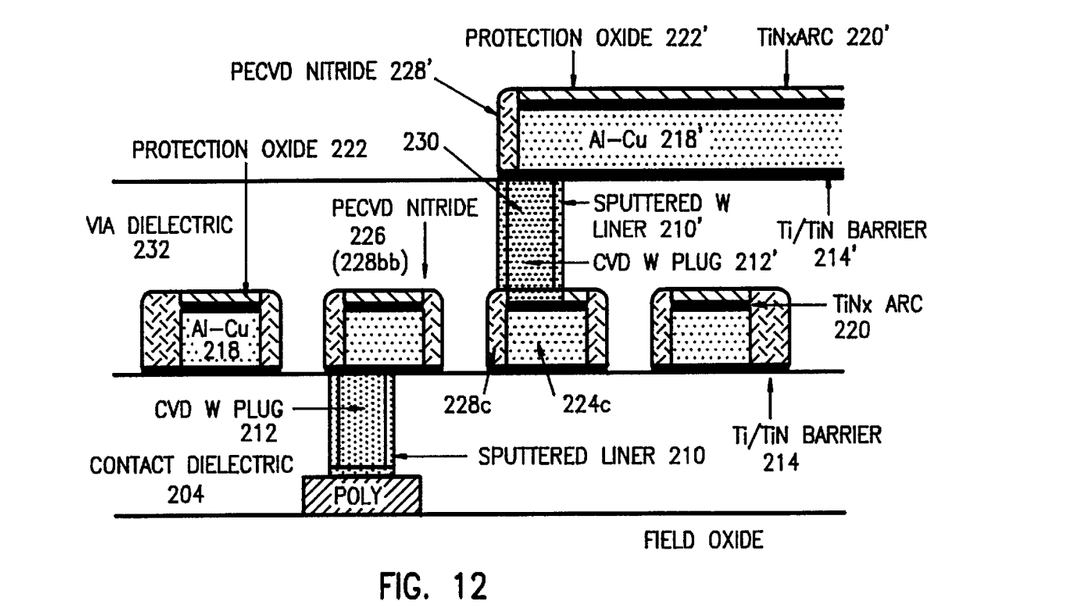
FIG. 12 shows the integrated circuit portion of FIG. 11 after a further barrier layer has been formed above the via and via dielectric, a metal line has been formed above the barrier layer, and an etch stop spacer has been formed.
Figure 13:
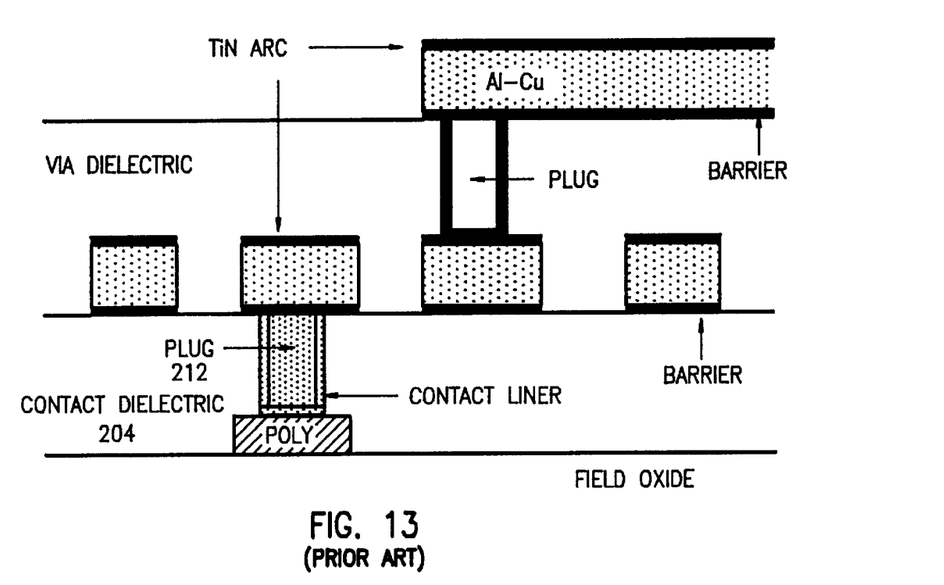
FIG. 13 shows an integrated circuit portion having interconnects formed therein by a conventional method.

As can be seen from FIG. 12 (and, alternatively, from FIG. 19), even if the via 230 is misaligned with the metal line 224c, a portion of the via 230 not enclosed by the metal is enclosed by at least a portion of the etch stop spacer 228ca.

Figure 19:
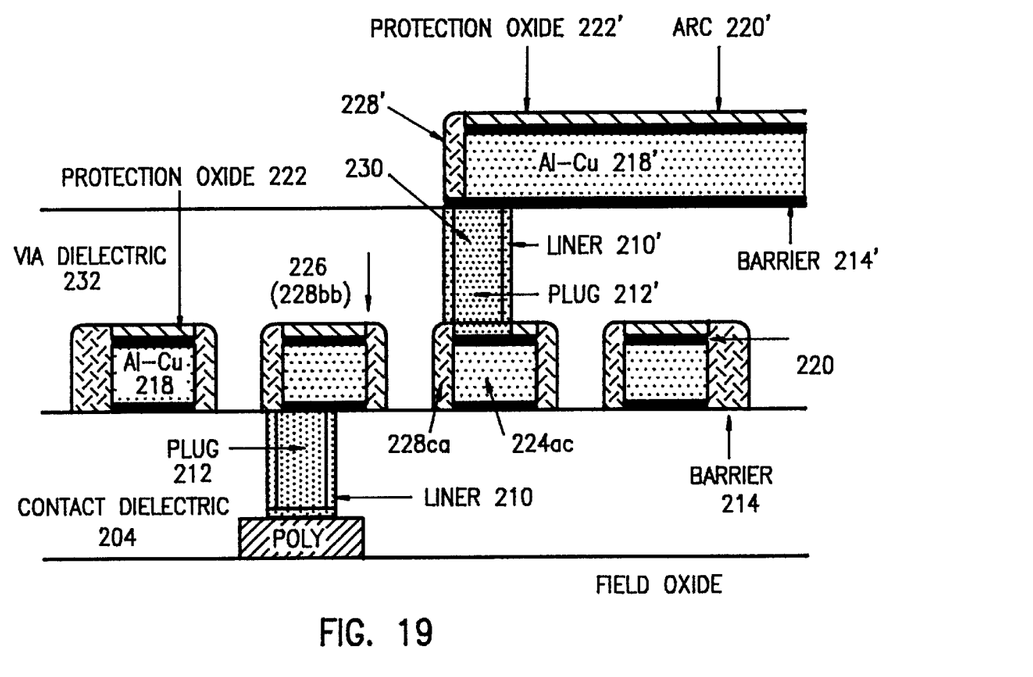
FIG. 19 shows the integrated circuit portion of FIG. 18 after a further barrier layer has been formed above the via and via dielectric, a metal line has been formed above the barrier layer, and an etch stop spacer has been formed.

The process illustrated in FIGS. 4–11 (or, alternately, FIGS. 4–7 and 14–18) can be repeated to form further interconnect layers, where the via dielectric layer 232 is considered to be the foundation layer and the via 230 is considered to be the trench. For example, FIG. 12 shows the integrated circuit portion 200 after a further barrier layer 214' has been formed above the via 230 and via dielectric 232. (FIG. 19 shows the integrated circuit portion 200 after a further barrier layer 214' has been formed above the via 230 and via dielectric 232.) A metal line 218',including an ARC layer 220',has been formed above the barrier layer 214'. An etch stop spacer 228' has been formed, as discussed with respect to FIGS. 4–10, so that the via 230 is completely overlapped even though the metal line 218' is misaligned to the via 230.

A process for fabricating a borderless interconnect architecture, as well as the borderless interconnect architecture itself, has been described. The die size reduction which can be achieved with such an architecture is appreciable.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A method of forming interconnecting layers in a semiconductor device over a foundation layer, the foundation layer including a dielectric layer having at least one trench formed therein, the at least one trench being filled with a plug material, and the foundation layer further including a barrier layer formed atop the foundation layer, the method comprising the steps of:

a) forming a metal layer on the surface of the barrier layer;
   b) forming a protection layer on the surface of the metal layer;
   c) patterning the protection layer and the metal layer to define a line of composite protection/metal on the surface of the barrier layer;
   d) forming an etch stop layer which substantially conforms to the shape of the line of composite protection/metal on the surface of the barrier layer;
   e) removing selected portions of the etch stop layer to expose the protection surface of the composite protection/metal line and portions of the barrier layer while leaving etch stop spacers conforming to at least one sidewall portion of the line;
   f) removing portions of the barrier layer between the etch stop spacers;
   g) forming a layer of via dielectric that covers, and extends above, the line;
   h) removing a portion of the via dielectric layer above the composite protection/metal line to expose a portion of the protection surface of the composite protection/metal line; and
   i) removing a portion of the protection surface from the composite protection/metal line, to expose the metal portion of the line, wherein step h) includes applying an etch chemistry to the via dielectric, the etch chemistry characterized by an etch stop spacers to via dielectric selectivity greater than one, and wherein step i) includes applying an etch chemistry to the protection layer, the etch chemistry characterized by an etch stop spacers to protection layer selectivity greater than one.

2. The method of claim 1, wherein step c) comprises:

c1) forming a photo-resist layer on the surface of the protection layer;
   c2) masking portions of the photo-resist layer to produce a desired interconnect pattern in the photo-resist;
   c3) exposing the protection layer to a protection layer etch chemistry, removing the portions of the protection layer that are not masked by the photo-resist, to expose portions of the metal layer; and
   c4) exposing the metal layer to a metal layer etch chemistry, removing the exposed portions of the metal layer to define the line of composite protection/metal.

3. The method of claim 2, wherein the protection layer is an oxide, the protection layer etch chemistry is fluorine-based, and the metal layer etch chemistry is chlorine-based.

4. The method of claim 3, wherein the metal layer etch is anisotropic.

5. The method of claim 4, wherein the protection layer etch chemistry is anisotropic.

6. The method of claim 3, wherein in step c4) a portion, but not all, of the barrier layer beneath the removed portions of the metal layer is removed such that the foundation layer remains covered.

7. The method of claim 1, wherein step e) comprises:

e1) exposing the etch stop layer to a second etch chemistry which is such that the etch chemistry completely removes the selected portions of the etch stop layer while the etch chemistry removes only a portion of the protection layer which remains after step c).

8. The method of claim 7, wherein the protection layer comprises a silicon oxide, the etch stop layer is silicon nitride, and the etch chemistry to which the etch stop layer is exposed in step e1) comprises fluorine.

9. The method of claim 7, wherein the etch chemistry to which the etch stop layer is exposed in step e1) removes the selected portions of the etch stop layer anisotropically.

10. The method of claim 1, wherein the metal layer includes a primary layer formed on the surface of the barrier layer and an anti-reflection coating formed on the surface of the primary layer.

11. The method of claim 1, wherein after steps a) through i) have been performed, the via dielectric layer is considered to be the steps barrier layer and the via is considered to be the trench, after a further barrier layer is formed and the steps a) to i) are repeated.

* * * * *

UNITED STATES PATENT AND TRADEMARK OFFICE
CERTIFICATE OF CORRECTION

PATENT NO.: 5,858,875
DATED: January 12, 1999
INVENTOR(S): Henry Wei-Ming Chung et al.

It is certified that errors appear in the above-identified patent and that said Letters Patent is hereby corrected as shown below:

In Col. 8, line 47, delete "steps barrier" and replace with --foundation--.

In Col. 8, line 48, after "trench," insert --and--.

In Col. 8, line 48, after "formed", delete "and".

Signed and Sealed this

Fourth Day of May, 1999

Q. TODD DICKINSON

*Attest:*

*Attesting Officer*  *Acting Commissioner of Patents and Trademarks*